US011749723B2

United States Patent
Vellianitis

(10) Patent No.: US 11,749,723 B2
(45) Date of Patent: Sep. 5, 2023

(54) SEMICONDUCTOR DEVICE AND MANUFACTURING METHOD THEREOF

(71) Applicant: Taiwan Semiconductor Manufacturing Company, Ltd., Hsin-Chu (TW)

(72) Inventor: Georgios Vellianitis, Heverlee (BE)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/869,915

(22) Filed: Jul. 21, 2022

(65) Prior Publication Data

US 2022/0367645 A1    Nov. 17, 2022

Related U.S. Application Data

(63) Continuation of application No. 17/086,644, filed on Nov. 2, 2020, now Pat. No. 11,404,543.

(Continued)

(51) Int. Cl.
*H01L 29/22* (2006.01)
*H01L 21/82* (2006.01)
(Continued)

(52) U.S. Cl.
CPC .... *H01L 29/221* (2013.01); *H01L 21/823412* (2013.01); *H01L 29/66477* (2013.01); *H01L 29/78* (2013.01)

(58) Field of Classification Search
CPC . H01L 29/221; H01L 29/66477; H01L 29/78; H01L 21/823412
(Continued)

(56) References Cited

U.S. PATENT DOCUMENTS 9,023,684 B2 * 5/2015 Suzawa ............... H01L 29/7869
257/E21.409
2015/0162452 A1    6/2015 Koezuka et al.
(Continued)

FOREIGN PATENT DOCUMENTS

| EP | 3236503 A1 | 10/2017 |
| JP | 2018157210 A | 10/2018 |
| TW | 201926564 A | 7/2019 |

OTHER PUBLICATIONS

Nakashima et al. "Origin of Major Donor States in In—Ga—Zn Oxide." Journal of Applied Physics 116, 213703 (2014), published on Dec. 2, 2014.
(Continued)

*Primary Examiner* — Monica D Harrison
(74) *Attorney, Agent, or Firm* — Eschweiler & Potashnik, LLC

(57) ABSTRACT

A semiconductor device and a manufacturing method thereof are provided. The semiconductor device includes a semiconductor channel layer, a gate structure, complex regions, a source terminal and a drain terminal. The gate structure is disposed on the semiconductor channel layer. The source terminal and the drain terminal are disposed on the semiconductor channel layer. The complex regions are respectively disposed between the source terminal and the semiconductor channel layer and between the drain terminal and the semiconductor channel layer.

20 Claims, 13 Drawing Sheets

Related U.S. Application Data

(60) Provisional application No. 63/041,138, filed on Jun. 19, 2020.

(51) Int. Cl.
*H01L 29/221* (2006.01)
*H01L 21/8234* (2006.01)
*H01L 29/78* (2006.01)
*H01L 29/66* (2006.01)

(58) Field of Classification Search
USPC .......................................................... 257/43
See application file for complete search history.

(56) References Cited

U.S. PATENT DOCUMENTS

| | | |
|---|---|---|
| 2017/0194502 A1 | 7/2017 | Baeck |
| 2018/0005876 A1 | 1/2018 | Tung et al. |
| 2021/0005752 A1 | 1/2021 | Okazaki et al. |

OTHER PUBLICATIONS

Non-Final Office Action dated Sep. 21, 2021 for U.S. Appl. No. 17/086,644.

Notice of Allowance dated Mar. 29, 2022 for U.S. Appl. No. 17/086,644.

\* cited by examiner

SEMICONDUCTOR DEVICE AND MANUFACTURING METHOD THEREOF

REFERENCE TO RELATED APPLICATIONS

This application is a Continuation of U.S. application Ser. No. 17/086,644, filed on Nov. 2, 2020, which claims the benefit of U.S. Provisional Application No. 63/041,138, filed on Jun. 19, 2020. The contents of the above-referenced patent applications are hereby incorporated by reference in their entirety.

BACKGROUND

Following the developments in semiconductor manufacturing technologies, more and more semiconductor devices and electronic components are integrated together, leading to high integration density.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
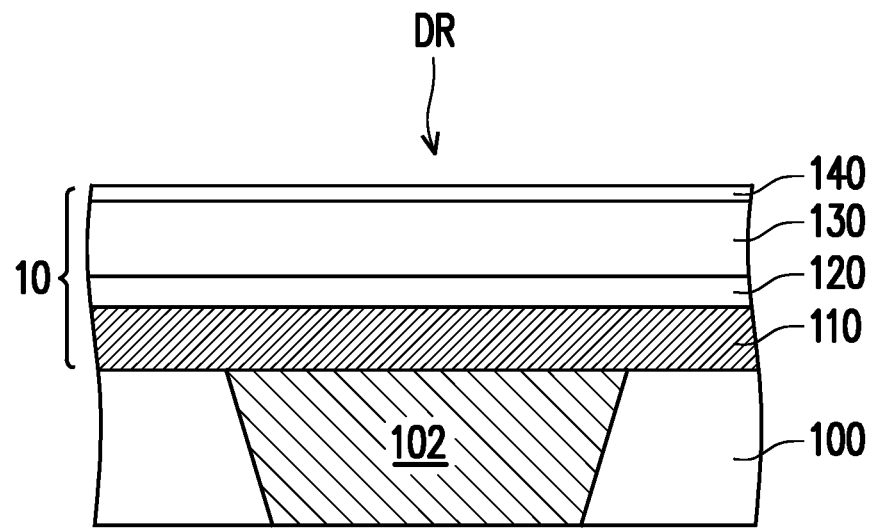
FIG. 1 to FIG. 6 are schematic cross-sectional views of various stages in a manufacturing method of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

It should be appreciated that the following embodiment(s) of the present disclosure provides applicable concepts that can be embodied in a wide variety of specific contexts. The specific embodiment(s) discussed herein is merely illustrative and is related to an integration structure containing more than one type of semiconductor devices, and is not intended to limit the scope of the present disclosure. Embodiments of the present disclosure describe the exemplary manufacturing process of integration structures formed with one or more semiconductor devices such as transistors and the integration structures fabricated there-from. Certain embodiments of the present disclosure are related to the structures including semiconductor transistors and other semiconductor devices. The substrates and/or wafers may include one or more types of integrated circuits or electronic components therein. The semiconductor device(s) may be formed on a bulk semiconductor substrate or a silicon/germanium-on-insulator substrate. The embodiments are intended to provide further explanations but are not used to limit the scope of the present disclosure.

Figure 9:
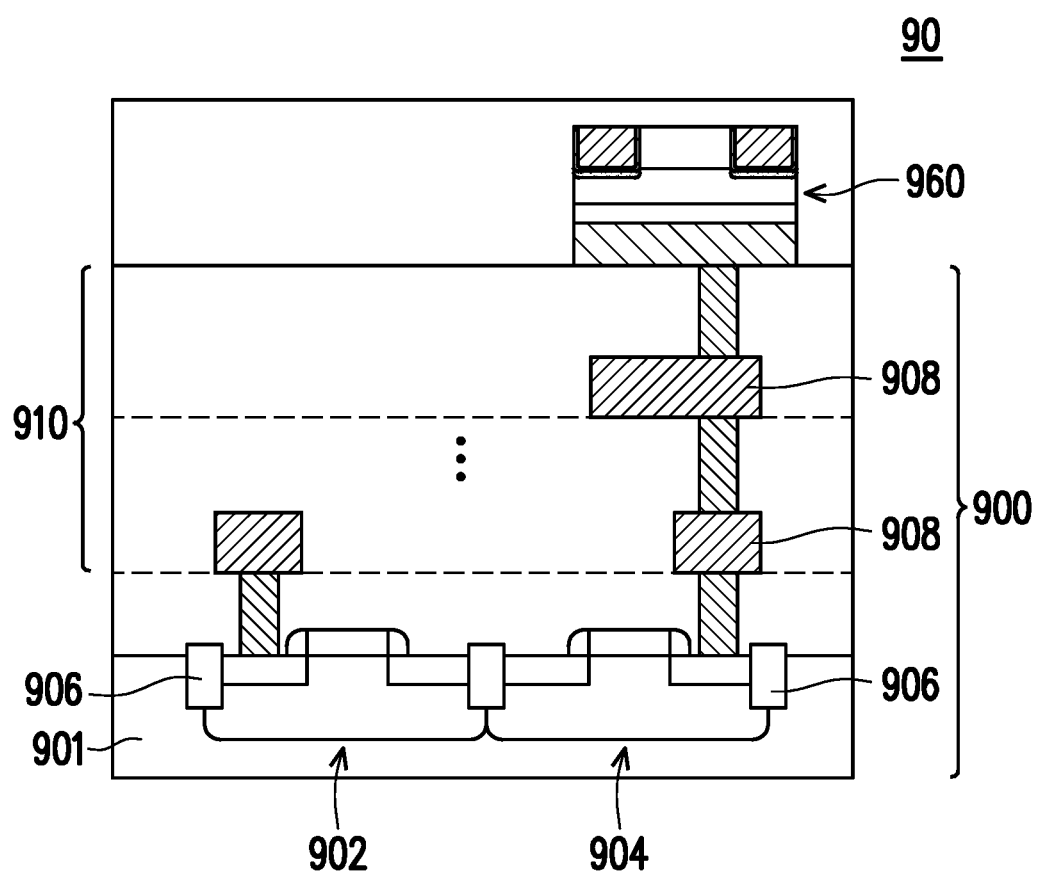
FIG. 9 is a schematic cross-sectional view showing a portion of the structure and a semiconductor device therein in accordance with some embodiments of the disclosure.

FIG. 1 through FIG. 6 are schematic cross-sectional views of various stages in a manufacturing method of a semiconductor device in accordance with some embodiments of the disclosure. From FIG. 1 through FIG. 6, schematic cross-section views of a device region DR of the integration structure are shown. FIG. 9 is a schematic cross-sectional view showing a portion of the structure and a semiconductor device therein in accordance with some embodiments of the disclosure.

Referring to FIG. 1, in some embodiments, a substrate 100 having one or more connection structure 102 therein is provided. As shown in FIG. 1, in some embodiments, the connection structure 102 (only one is shown) is formed in the substrate 100 within the device region DR. It is understood that the number of the connection structure 102 may be more than one, and the number or the configuration of the connection structure 102 should not be limited by the exemplary embodiments or drawings of this disclosure. In FIGS. 1-6, only a portion of the device region DR of the substrate 100 is shown for illustration purposes. In some embodiments, the substrate 100 also includes one or more active component such as transistors, diodes, optoelectronic devices and/or one or more passive components such as capacitors, inductors and resistors. Referring to FIG. 9, the integration structure 90 includes a substrate 900 and a semiconductor device 960 formed over the substrate 900. In some embodiments, the substrate 900 is substantially similar to the substrate 100 of FIG. 1.

Referring to FIG. 1 and FIG. 9, in some embodiments, either the substrate 100 or the substrate 900 includes a semiconductor substrate. In one embodiment, the substrate 100 or 900 comprises a crystalline silicon substrate or a doped semiconductor substrate (e.g., p-type semiconductor substrate or n-type semiconductor substrate). In certain embodiments, the substrate 100 or 900 comprises one or more doped regions or various types of doped regions, depending on design requirements. In some embodiments, the doped regions are doped with p-type and/or n-type dopants. For example, the p-type dopants are boron or BF2 and the n-type dopants are phosphorus or arsenic. The doped regions may be configured for an n-type metal-oxide-semiconductor (MOS) transistor or a p-type MOS (PMOS) transistor. In some alternative embodiments, the substrate 100 or 900 includes a semiconductor substrate made of other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In some embodiments, as shown in FIG. 9, the substrate 900 includes transistors such as a NMOS 902 and a PMOS 904 formed in the semiconductor substrate 901. In one embodiment, the NMOS 902 and/or the PMOS 904 are formed following the complementary MOS (CMOS) processes. As shown in FIG. 9, in some embodiments, more than one isolation structures 906 are formed in the semiconductor substrate 901. In certain embodiments, the isolation structures 906 are trench isolation structures. In other embodiments, the isolation structures 906 includes local oxidation of silicon (LOCOS) structures. In some embodiments, the insulator material of the isolation structures 906 includes silicon oxide, silicon nitride, silicon oxynitride, a spin-on dielectric material, or a low-k dielectric material. In one embodiment, the insulator material may be formed by CVD such as high-density-plasma chemical vapor deposition (HDP-CVD) and sub-atmospheric CVD (SACVD) or formed by spin-on. In certain embodiments, the transistors such as the NMOS 902 and the PMOS 904 and the isolation structures 906 are formed in the substrate 900 during the front-end-of-line (FEOL) processes.

In some embodiments, the substrate 900 includes metallization structures 908 embedded in an insulation layer 910. As shown in FIG. 9, the insulation layer 910 and the metallization structures 908 are located over the transistors formed in the semiconductor substrate 901. In some embodiments, the insulation layer 910 includes one or more dielectric layers. In some embodiments, a material of the insulation layer 910 includes silicon oxide, a spin-on dielectric material, a low-k dielectric material or a combination thereof. The formation of the insulation layer 910 includes performing one or more processes by chemical vapor deposition (CVD) or by spin-on, for example. In some embodiments, the metallization structures 908 include interconnect structures, such as metal lines, via and contact plugs. In certain embodiments, the materials of the metallization structures 908 include aluminum (Al), aluminum alloys, copper (Cu), copper alloys, tungsten (W), or combinations thereof. In exemplary embodiments, the transistors such as the NMOS 902 and the PMOS 904 are electrically connected with the metallization structures 908, and some of the transistors are further electrically interconnected through the metallization structures 908. The metallization structures 908 shown herein are merely for illustrative purposes, and the metallization structures 908 may include other configurations and may include one or more through vias and/or damascene structures.

Referring back to FIG. 1, in some embodiments, the connection structure 102 embedded in the substrate 100 may be a part of metallization structures in the substrate 100 for electrical connection and interconnection, and the metallization structures in the substrate 100 are similar to the metallization structures 908 as depicted in FIG. 9. In one embodiment, the connection structure 102 includes a conductive via. Herein the connection structure 102 may be optional and representatively shown for electrical connection purposes. In FIG. 1, a gate material layer 110 is blanketly formed over the substrate 100 covering the connection structure. In one embodiment, the gate material layer 110 is in direct contact with the connection structure 102. In some embodiments, the gate material layer 110 includes one or more metallic material layers. In some embodiments, the formation of the gate material layer 110 includes one or more deposition processes selected from chemical vapor deposition (CVD) (such as, plasma enhanced CVD (PECVD) and laser-assisted CVD), atomic layer deposition (ALD), and physical vapor deposition (PVD) (such as, sputtering, and e-beam evaporation). In some embodiments, the formation of the gate material layer 110 includes a plating process. In some embodiments, the gate material layer 110 is formed with a thickness ranging from about 5 nm to about 100 nm. In some embodiments, the materials of the gate material layer 110 include aluminum (Al), titanium (Ti), tungsten (W), tantalum (Ta), nitride thereof, combinations thereof, and/or alloys thereof. For example, the gate material layer 110 may include one or more stacked layers of TiN, TaN, W/TiN, TiN/TiAl/TiN or TiN/TiAl/TaN.

In FIG. 1, in some embodiments, a gate dielectric material layer 120 is globally formed over the gate material layer 110. In some embodiments, the gate dielectric material layer 120 includes one or more high-k dielectric materials, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or combinations thereof. In some embodiments, the gate dielectric material layer 120 includes one or more materials selected from aluminum oxide, hafnium oxide, tantalum oxide and zirconium oxide. In some embodiments, the formation of the gate dielectric material layer 120 includes one or more deposition processes selected from CVD (such as, PECVD and laser-assisted CVD), ALD and PVD (such as, sputtering and e-beam evaporation). In some embodiments, the gate dielectric material layer 120 is formed with a thickness ranging from about 1 nm to about 20 nm. In some embodiments, the materials of the gate dielectric material layer 120 include aluminum oxide, hafnium oxide, or combinations thereof. For example, the gate dielectric material layer 120 may be formed by depositing a composite layer of $HfO_2/Al_2O_3$ through ALD.

In some embodiments, after forming the gate dielectric material layer 120, a semiconductor material layer 130 and an optional blocking material layer 140 are sequentially formed over the gate dielectric material layer 120 to form a stack structure 10. In some embodiments, the material of the semiconductor material layer 130 includes a metal oxide material. In some embodiments, the material of the blocking material layer 140 includes a semiconductor material or a metal oxide material. In some embodiments, the formation of the semiconductor material layer 130 and the blocking material layer 140 includes one or more deposition processes selected from CVD (such as, PECVD and laser-assisted CVD), ALD, and PVD (such as, sputtering, pulse laser deposition (PLD) and e-beam evaporation). Optionally, when the formation of the semiconductor material layer 130 includes a CVD process or ALD process, an annealing process may be included. In some embodiments, the semiconductor material layer 130 and the blocking material layer 140 are formed sequentially but continuously in the same PVD process or within the same reaction tool. In some embodiments, using the same deposition process, the semiconductor material layer 130 is blanketly deposited over the gate dielectric material layer 120 and then the blocking material layer 140 is blanketly formed over the top surface of the semiconductor material layer 130 as a blocking layer. In some embodiments, the semiconductor material layer 130 and the blocking material layer 140 are formed individually through different processes. In one embodiment, the semiconductor material layer 130 is formed with a thickness ranging from about 1 nm to about 50 nm, and the blocking material layer 140 is formed with a thickness substantially equivalent to or smaller than about 5 nm. In some embodiments, the semiconductor material layer 130 has a thickness larger than that of the blocking material layer 140. In some embodiments, the material of the semiconductor material layer 130 includes indium gallium zinc oxide (IGZO), or a similar conducting oxide semiconductor material such as indium tin oxide (ITO), indium tungsten oxide (IWO), indium zinc oxide (IZO) or zinc tin oxide (ZTO) or combinations thereof. In some embodiments, the material of the blocking material layer 140 includes silicon (e.g. polysilicon), ITO or IGZO doped with silicon, mixtures thereof, or the combinations thereof. In certain embodiments, the material of the blocking material layer 140 includes polysilicon or silicon-doped IGZO, mixtures thereof, or the combinations thereof. In some embodiments, the semiconductor material layer 130 is deposited by an ALD process and the blocking material layer 140 is also formed by the ALD process, and the reactants used in the ALD process may be adjusted or shifted. In one embodiment, the material of the blocking material layer 140 is different from the material of the semiconductor material layer 130. For example, the formation of the blocking material layer 140 protects the surface of the semiconductor material layer 130 (such as IGZO or other suitable materials).

Figure 2:
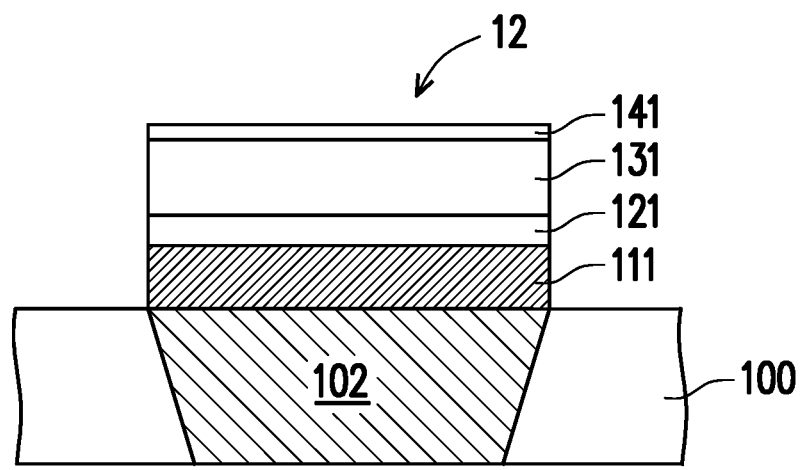

Referring to FIG. 1 and FIG. 2, in some embodiments, a patterning process is performed to the stack structure 10 of the gate material layer 110, the gate dielectric material layer 120, the semiconductor material layer 130 and the blocking material layer 140, so that the stack structure 10 is patterned to form a stack structure 12 having a gate layer 111, a gate dielectric layer 121, a semiconductor layer 131 and a blocking layer 141 stacked in sequence from the bottom to the top. In some embodiments, the stack structure 10 of the gate material layer 110, the gate dielectric material layer 120, the semiconductor material layer 130 and the blocking material layer 140 is patterned into the stack structure 12 in one continuous patterning process. In some embodiments, the gate material layer 110, the gate dielectric material layer 120, the semiconductor material layer 130 and the blocking material layer 140 are sequentially patterned through multiple patterning processes. As shown in FIG. 2, in exemplary embodiments, the patterned stack structure 12 is disposed on the connection structure 102, exposing the substrate 100. The sidewalls of the stack structure 12 in FIG. 2 may be shown to be vertically aligned or coplanar, and the stack structure 12 may be shown to be patterned into substantially the same pattern design or configuration. However, it is understood that the various layers of the stack structure 12 may have different patterns or configurations depending on product designs. In some embodiments, the patterning and the formation of the stack structure 12 include performing a photolithographic process and an anisotropic etching process. In some embodiments, a photoresist pattern (not shown) may be used as an etching mask so that portions of the stack structure 10 uncovered by the photoresist pattern are removed during the etching process, and then the photoresist pattern is removed thorough a stripping process.

Figure 3:
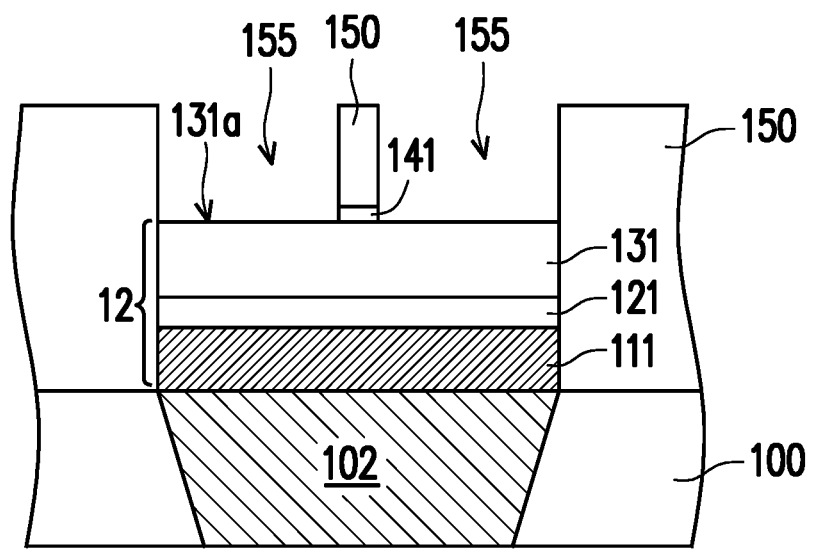

Referring to FIG. 3, an interlayer dielectric (ILD) layer 150 with contact openings 155 is formed over the substrate 100. In some embodiments, the material of the ILD layer 150 includes silicon oxide, silicon nitride, silicon oxynitride, or one or more low-k dielectric materials. Examples of low-k dielectric materials include silicate glass such as fluoro-silicate-glass (FSG), phospho-silicate-glass (PSG) and boro-phospho-silicate-glass (BPSG), BLACK DIAMOND®, SILK®, FLARE®, hydrogen silsesquioxane (HSQ), fluorinated silicon oxide (SiOF), amorphous fluorinated carbon, parylene, BCB (bis-benzocyclobutenes), or a combination thereof. It is understood that the ILD layer 150 may include one or more dielectric materials or one or more dielectric layers. In some embodiments, the ILD layer 150 is formed to a suitable thickness through CVD (such as flowable CVD (FCVD), PECVD, high Density Plasma CVD (HDPCVD), sub-atmospheric CVD (SACVD) and low-pressure CVD (LPCVD)), spin-on coating, or other suitable methods. For example, the ILD layer 150 may be formed by PECVD to cover the exposed substrate 100 and the stack structure 12 having the gate layer 111, the gate dielectric layer 121, the semiconductor layer 131 and the blocking layer 141. Later, the contact openings 155 are formed in the ILD layer 150 exposing the semiconductor layer 131. For example, the formation of the contact openings 155 includes forming a patterned mask layer (not shown) over the ILD layer 150, anisotropic etching the ILD layer 150 and the blocking layer 141 using the patterned mask layer as a mask to form contact openings 155 exposing the semiconductor layer 131.

In FIG. 3, a portion of the remained blocking layer 141 is located between the contact openings 155. As seen in FIG. 3, the contact openings 155 are shown with substantially vertical sidewalls. It is understood that the contact openings may be formed with slant sidewalls if feasible.

Figure 4:
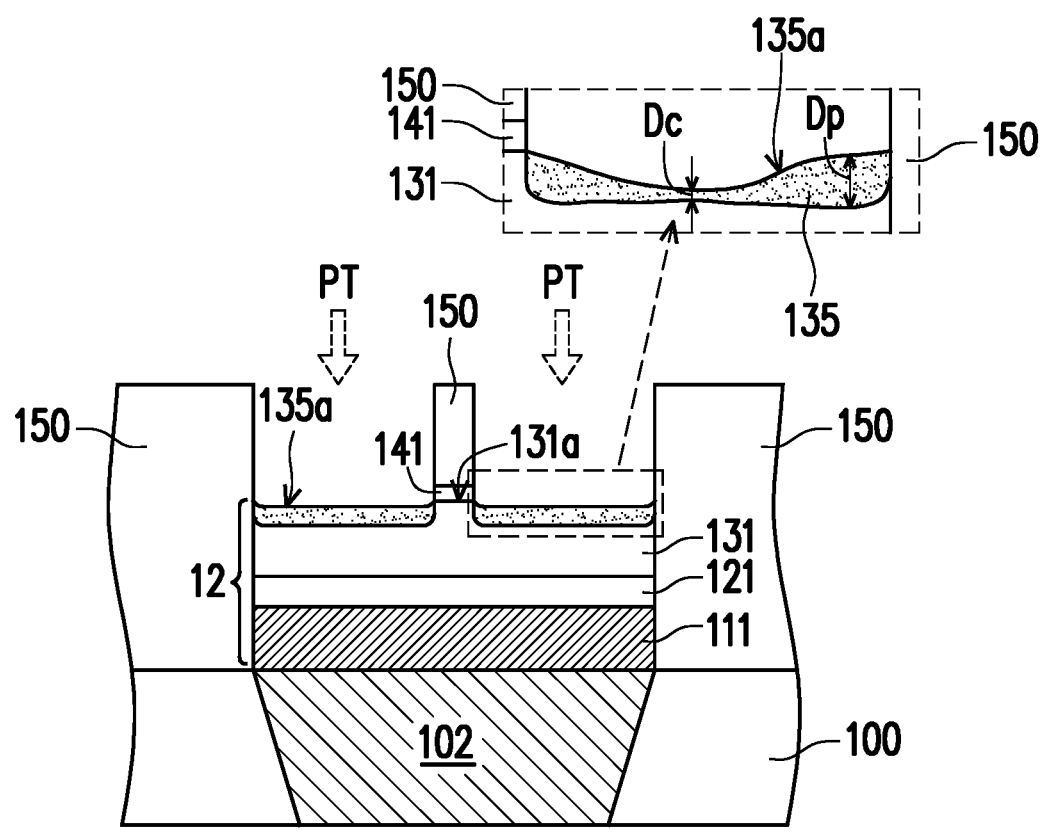

In FIG. 4, a processing treatment PT is performed to the semiconductor layer 131 that is exposed by the contact openings 155 and complex regions 135 are formed in the semiconductor layer 131. In some embodiments, the processing treatment PT includes performing an argon plasma treatment and then a hydrogen annealing process. Optionally, in some embodiments, the processing treatment PT further includes performing an oxygen annealing process following the hydrogen annealing process. In one embodiment, the argon plasma treatment is performed with a processing time ranging from about 1 second to 1 minute in a plasma chamber with a power ranging between 100 W to 1500 W and a base pressure of about 1 mT to about 150 mT. In some embodiments, the hydrogen annealing process is performed with a processing time ranging from about 1 minute to 1 hour under the temperature ranging from room temperature to about 450 degrees Celsius, in the ambient atmosphere of hydrogen gas ($H_2$) or a mixture of hydrogen gas and nitrogen gas ($H_2/N_2$) in a plasma chamber or using a hydrogen plasma. In one embodiment, the oxygen annealing process is performed with a processing time ranging from about 1 minute to 1 hour under the temperature ranging from room temperature to about 450 degrees Celsius, in the ambient atmosphere of oxygen gas ($O_2$) or a mixture of oxygen gas and nitrogen gas ($O_2/N_2$) in a plasma chamber or using an oxygen plasma. During the argon plasma treatment, through the bombardment of plasma or charges to the exposed surface 131a of the semiconductor layer 131, more oxygen vacancies are generated in the semiconductor layer 131. At the oxygen vacancy sites (oxygen atom absent from the crystal lattice), negative charge carriers are withdrawn to the vacancy sites and the local charge density is increased. In the later performed hydrogen annealing process, hydrogen is trapped in the oxygen vacancy sites and hydrogen passivation stabilizes the oxygen vacancies, so that a stable hydrogen-containing complex is formed at the sites to form the complex regions 135. In some embodiments, the complex region(s) 135 has higher doping levels, compared with untreated semiconductor layer 131. In some embodiments, the complex region(s) 135 is formed at the location corresponding to the location of a later-formed contact. In one embodiment, the complex region(s) 135 has a higher electron doping level (for example, having a doping level value ranging from 1E19 $cm^{-3}$ to 1E21 $cm^{-3}$). The formed stable complex in the complex region(s) 135 may serve as a shallow level donor. In FIG. 4, the remained blocking layer 141 may function as the hydrogen blocking layer to hinder H entering into the semiconductor layer 131 at undesirable locations (i.e. locations other than the contact opening locations) during the processing treatment PT, especially during the hydrogen annealing process. In some embodiments, the oxygen annealing process may further stabilize un-passivated oxygen vacancies and reduce oxygen vacancies in the semiconductor layer 131.

In some embodiments, during the processing treatment PT, the exposed portions of the top surface 131a of the semiconductor layer 131 are bombarded and damaged during the plasma treatment, and the later formed complex regions 135 extend from the treated surface 135a further into the semiconductor layer 131. In some embodiments, the treated surface 135a has a surface roughness higher than that of the untreated top surface 131a of the semiconductor layer 131. In certain embodiments, dishing may occur in the exposed portions of the top surface 131a of the semiconductor layer 131, and the complex region(s) 135 may have a dished or bowl-shape surface. The complex region(s) 135 formed in the semiconductor layer 131 that are exposed by the contact openings 155 may have a thickness (i.e. a depth extend vertically along the thickness direction from the top surface 135a into the semiconductor layer 131) varying at different locations. For example, the complex region 135 may be shaped like a disc with a varying depth at different locations. Alternatively, the complex region 135 may be shaped like a disc with a uniform depth.

Referring to the partially enlarged view at the left part of FIG. 4, the complex region(s) 135 formed in the semiconductor layer 131 may be damaged to have a dished or bowl-shape surface 135a, and the complex regions 135 extend vertically (along the thickness direction) from the top surface 135a into the semiconductor layer 131 with a maximum depth Dp at the peripheral portion and with a smaller depth Dc at the central portion (i.e. shallower in the central portion and thicker in the peripheral portion). For example, the complex region 135 may be shaped like a concave disc shallower in the central portion and thicker in the peripheral portion. In one embodiment, the maximum depth Dp ranges from about 2 nm to about 10 nm, and the depth Dc ranges from about 1 nm to about 5 nm. That is, the maximum depth is about twice of the smaller depth for the complex region 135, for example. Alternatively, the complex region 135 may be shaped like a disc thicker in the central portion and shallower in the peripheral portion. It is understood that the shape or profile of the complex region shown in the drawings is merely exemplary and not intended to limit the scope of the application.

Figure 5:
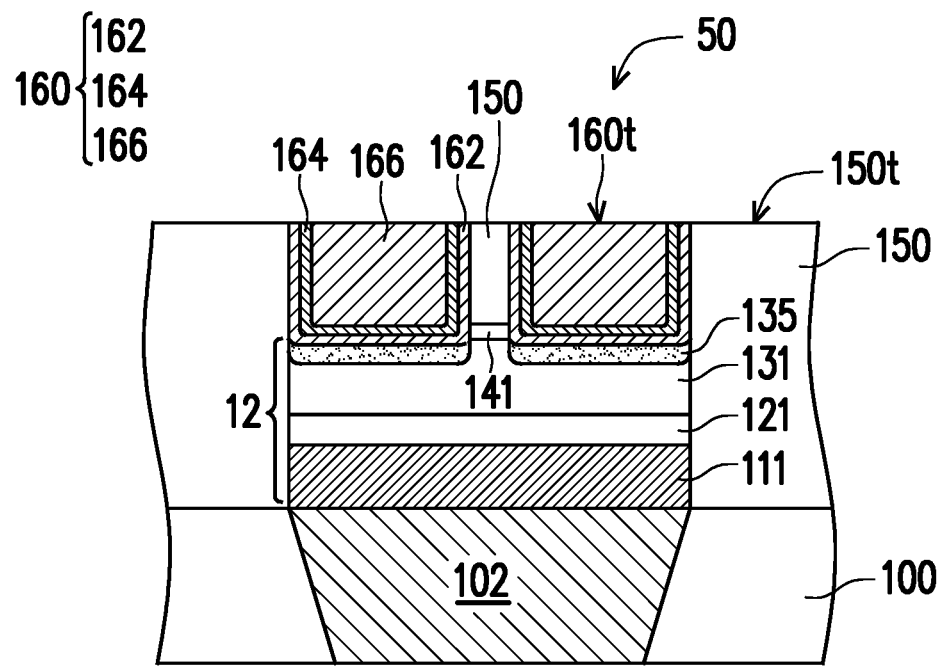

Thereafter, in FIG. 5, contact terminals 160 are formed in the contact openings 155 and are in direct contact with the complex regions 135. In some embodiments, a barrier layer 162 is deposited over the contact openings 155 and conformally covers the sidewalls of the contact openings 155 and covers the top surfaces 135a of the complex regions 135. In some embodiments, a seed layer 164 is formed over the contact openings 155 and on the barrier layer 162. In some embodiments, the barrier layer 162 is formed before forming the seed layer 164 to prevent out-diffusion of the material of the seed layer 164. After the seed layer 164 is formed to cover the sidewalls and the bottoms of the contact openings 155, metallic contacts 166 are then formed on the seed layer 164 within the contact openings 155 and fill the contact openings 155. As seen in FIG. 5, the contact terminals 160 are formed directly on the complex regions 135 with rough surfaces 135a. As the complex region(s) 135 has a higher electron doping level and increased conductivity, the contact resistance between the contact terminal(s) 160 and the complex region(s) 135 becomes lower. Also, in FIG. 5, a portion of the remained blocking layer 141 is sandwiched between the contact terminals 160 and located between the ILD layer 150 and the underlying semiconductor layer 131.

In some embodiments, a barrier material (not shown) and a seed material (not shown) are sequentially formed over the contact openings 155 and conformally covering the exposed surfaces of the complex regions 135 and the sidewalls of the contact openings 155, and a metallic material (not shown) is then filled into the contact openings 155 and on the seed material to form the metallic contacts 166. The barrier material, the seed material and the metallic material may individually include one or more materials selected tungsten (W), ruthenium (Ru), molybdenum (Mo), tantalum (Ta), titanium (Ti), alloys thereof, and nitrides thereof, for example. In some embodiments, the barrier material is formed by CVD or PVD. In some embodiments, the seed material is formed by CVD or PVD. In some embodiments, the metallic material is formed by CVD or PVD. In alternative embodiments, the formation of the metallic material may include performing a plating process (such as electrochemical plating (ECP)). In some embodiments, the barrier material includes titanium nitride (TiN) formed by the metal organic CVD (MOCVD) process, the seed material includes tungsten formed by CVD, and the metallic material includes tungsten formed by the CVD process (especially tungsten CVD processes). For example, the metallic contact 166 includes a tungsten contact and the barrier layer 162 includes a titanium nitride barrier layer.

In some embodiments, the extra barrier material, the extra seed material and the extra metallic material may be removed by performing a planarization process, an etching process, or other suitable processes. In some embodiments, the planarization process may include performing a chemical mechanical polishing (CMP) process. In some embodiments, the barrier layer 162, the seed layer 164 and the metallic contact 166 constitute contact terminals 160. As seen in FIG. 5, the top surface 150t of the ILD layer 150 is substantially flush with and levelled with the top surfaces 160t of the contact terminals 160. In some embodiments, the contact terminals 160 function as the source and drain terminals of the transistor. In FIG. 5, a transistor structure 50 is obtained. The transistor structure 50 includes the stack structure 12 having the gate layer 111, the gate dielectric layer 121, the semiconductor layer 131 and the blocking layer 141 sequentially stacked from the bottom to the top, and the contact terminals 160 located on the stack structure 12. The semiconductor layer 131 functions as a channel layer, and the complex regions located between the contact terminals 160 and the semiconductor layer 131 becomes complex interfaces and helps lowering the contact resistance of the source and drain terminals. In some embodiments, the transistor structure 50 is a bottom-gated transistor structure or a back-gate transistor structure.

Figure 6:
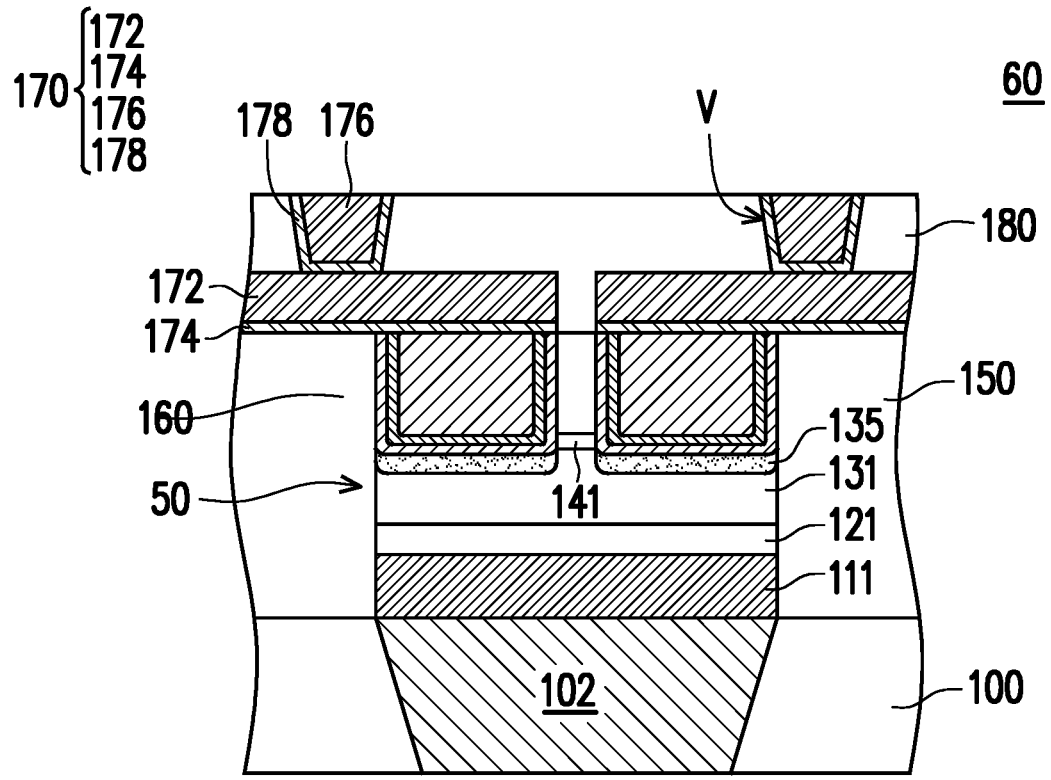

Referring to FIG. 6, in certain embodiments, an interconnecting structure 170 is formed on the ILD layer 150 and over the contact terminals 160, and the semiconductor device structure 60 is formed. In one embodiment, the interconnecting structure 170 is in direct contact with the contact terminals 160 and is electrically connected with the contact terminals 160 of the transistor structure 50, so that the transistor structure 50 is further electrical connected to other components or devices. In some embodiments, the interconnecting structure 170 includes first metal lines 172 formed on first liner layers 174 and first metal vias 176 surrounded by the second liner layers 178. In some embodiments, a first liner material (not shown) is directly formed on the ILD layer 150 and on the top surfaces 160t of the contact terminals 160, a first metal layer (not shown) is formed on the first liner material, and then the first liner material and the first metal layer are patterned into the first metal lines 172 and the first liner layers 174 using photolithographic and etching techniques. The first liner material may be formed through, for example, PVD (such as sputtering), or CVD or the like. In some embodiments, the first liner material includes, for example, tantalum, tantalum nitride, titanium, titanium nitride, tungsten, tungsten nitride, combinations thereof, or other suitable materials. In some embodiments, the first liner layers 174 may prevent out-diffusion of the material of the first metal lines 172 and/or improve the adhesion of the first metal lines 172. In some embodiments, the first metal layer may be formed by performing a plating process such as electrochemical plating (ECP) or electroless plating, a PVD process or a CVD process. In some embodiments, the first metal layer includes, for example, copper, copper-aluminum alloys, tantalum, titanium, tungsten, alloys thereof, or other suitable metal materials.

In some embodiments, as shown in FIG. 6, the first metal lines 172 are in direct contact with and electrically connected with the contact terminals 160. For example, the first metal lines 172 may include copper or copper alloys, and may be formed by performing a PVD process and a CVD process. In one embodiment, a thickness of the first metal lines 172 may be adjusted according to design requirements. As shown in FIG. 6, in certain embodiments, another ILD layer 180 is formed over the ILD layer 150 and the first metal lines 172. The materials and formation methods of the ILD layer 180 may be similar to those of the ILD layer 150 and detailed descriptions thereof shall be omitted herein for simplicity. Later, via openings V are formed in the ILD layer 180 to partially expose the underlying first metal lines 172. The method(s) for forming the via openings V are similar to the methods for forming the contact openings 155. As seen in FIG. 6, the via openings V are shown with slant sidewalls. It is understood that the via openings may be formed with substantially vertical sidewalls if feasible.

In some embodiments, in FIG. 6, the second liner layers 178 are formed in the via openings V covering the sidewalls and the bottoms of the via openings V and then the first metal vias 176 are formed on the second liner layers 178 and within the via openings V. In some embodiments, a second liner material (not shown) is formed over the via openings V and conformally covering the exposed surfaces of the via openings V, and then a second metal layer (not shown) is formed over the ILD layer 180 and filled into the openings V. The formation methods and the materials of the second liner layers 178 are similar to those of the first liner layers 174. The formation methods and the materials of the first metal vias 176 are similar to those of the first metal lines 172. Detailed descriptions shall be skipped herein for simplicity. However, it is understood that the material of the first metal lines 172 may be different from that of the first metal vias 176, and the material of the first liner layer 174 may be different from that of the second liner layer 178.

The number and configurations of the metal lines and/or metal vias of the interconnecting structure 170 shown in FIG. 6 are merely for illustration, in some alternative embodiments, more than two metal lines or metal vias may be formed in accordance with actual design requirements. Furthermore, multiple levels of interconnecting structures may be formed for electrical connection and interconnection.

The semiconductor device structure 60 illustrates an integrated circuit, or portion thereof. In some embodiments, the semiconductor device structure 60 comprises active devices such as oxide semiconductor thin film transistors, high voltage transistors, and/or other suitable components. In some embodiments, the semiconductor device structure 60 additionally includes passive components, such as resistors, capacitors, inductors, and/or fuses. In some embodiments, additional steps may be provided before, during, and after the process steps depicted from FIG. 1 to FIG. 6, and some of the steps described above may be replaced or eliminated, for additional embodiments of the method.

In the illustrated embodiments, the described methods and structures may be formed compatible with the current semiconductor manufacturing processes. In exemplary embodiments, the described methods and structures are formed during back-end-of-line (BEOL) processes. In some embodiments, the described methods and structures may be formed during middle-of-line processes. In one embodiment, the transistor structure 50 includes an IGZO thin film transistor.

In the exemplary embodiments, the complex regions interfacing the channel layer (e.g. semiconductor layer) and the source and drain terminals result in more oxygen vacancies and higher doping levels in the channel layer directly under the contact terminals (in the contact areas of the channel layer), which lowers the contact resistance between the channel layer and the source and drain terminals. Overall, the performance of the semiconductor device is enhanced.

In the above-mentioned embodiments, by way of performing the processing treatment through the contact openings, the complex regions are formed in the semiconductor channel layer in a self-aligned way right under the contact terminals and liaise the contact terminals with the channel layer. In some embodiments, the complex regions formed in the semiconductor layer modulates the surface characteristics of the semiconductor layer in contact with the contact terminals and lowers the contact resistance between the semiconductor layer and the source and drain terminals.

Figure 7:
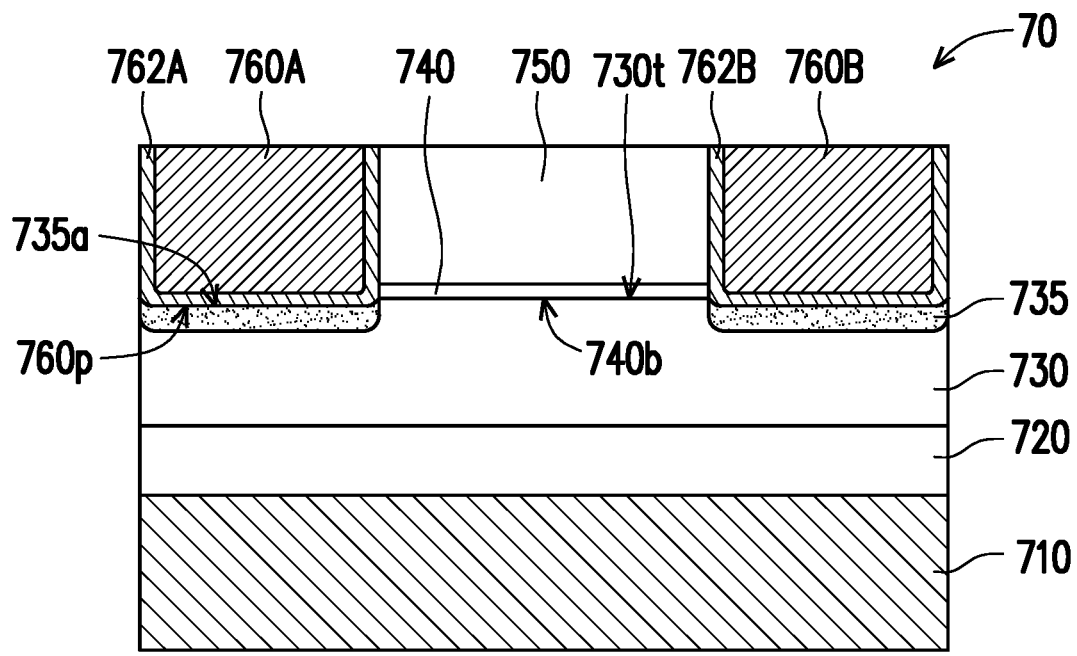
FIG. 7 and FIG. 8 are schematic cross-sectional views showing a semiconductor device in accordance with some embodiments of the disclosure.

FIG. 7 is a schematic cross-sectional view showing a semiconductor device in accordance with some embodiments of the disclosure. The exemplary structure shown in FIG. 7 may be fabricated following the process steps as described in the previous embodiments as shown from FIG. 1 to FIG. 6, but it is understood that any other compatible process steps or methods may be utilized and comprehensible modifications or adjustments may be made for forming the exemplary structure of this disclosure. Referring to FIG. 7, in some embodiments, the semiconductor device structure 70 includes a stack structure of a gate layer 710, a gate dielectric layer 720, a semiconductor layer 730 and a blocking layer 740 sequentially stacked from the bottom to the top. In some embodiments, the semiconductor device structure 70 includes a source terminal 760A and a drain terminal 760B located over the semiconductor layer 730, and complex regions 735 are respectively located between the source terminal 760A and the semiconductor layer 730 and between the drain terminal 760B and the semiconductor layer 730. In some embodiments, the source terminal 760A and the drain terminal 760B are separate from each other by an interlayer dielectric (ILD) layer 750 located there-between. In some embodiments, the source terminal 760A includes a barrier layer 762A and the drain terminal 760B also includes a barrier layer 762B. In some embodiments, the complex regions 735 are in direct contact with the source terminal 760A and the drain terminal 760B. In one embodiment, the complex region 735 has a roughened surface 735a rougher or coarser than the top surface 730t of the semiconductor layer 730. In one embodiment, the complex region 735 may have a dished surface 735a slightly concave relative to a top surface 730t of the semiconductor layer 730. In some embodiments, a portion of the blocking layer 740 located between the ILD layer 750 and the semiconductor layer 730 is sandwiched between the source terminal 760A and the drain terminal 760B. In FIG. 7, the complex regions 735 are sandwiched between the semiconductor layer 730. In one embodiment, the bottom surfaces 760p of the source terminal 760A and the drain terminal 760B are substantially flush with the bottom surface 740b of the blocking layer 740. In one embodiment, the bottom surfaces 760p of the source terminal 760A and the drain terminal 760B are slightly lower than the bottom surface 740b of the blocking layer 740. Applicable materials for individual layers or elements are described in the previous embodiments and will not be repeated herein again.

Figure 8:
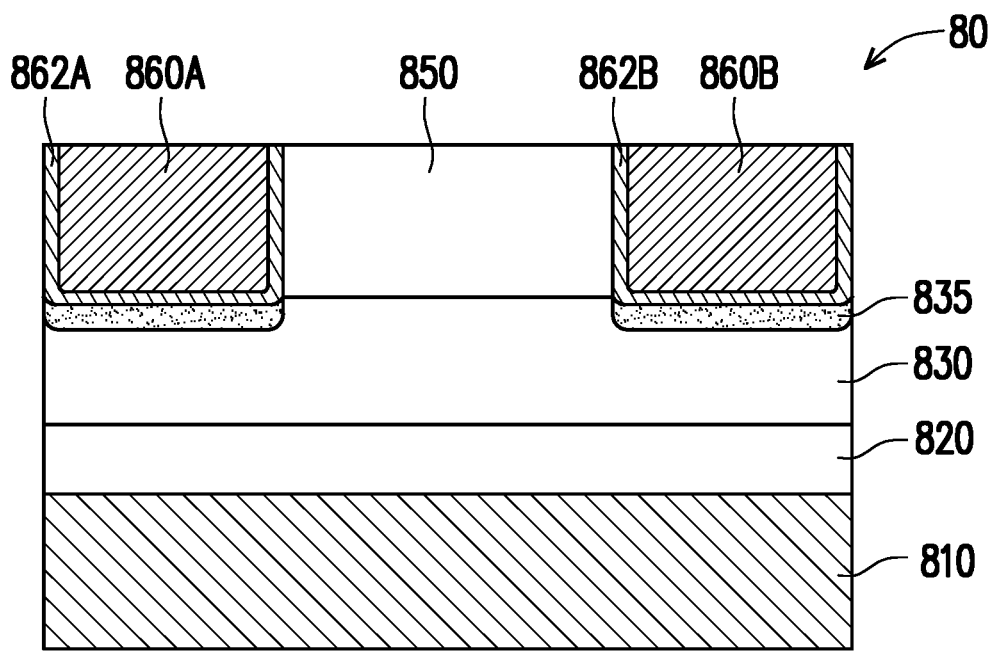

FIG. 8 is a schematic cross-sectional view showing a semiconductor device in accordance with some embodiments of the disclosure. The exemplary structure shown in FIG. 8 may be fabricated following similar process steps as described in the previous embodiments as shown from FIG. 1 to FIG. 6. However, in some embodiments, the formation of the blocking material layer is skipped. The structure shown in FIG. 8 is similar to but different from the structure shown in FIG. 7, and the main structural difference lies in the exclusion of the optional blocking layer in the semiconductor device structure 80 as shown in FIG. 8. Referring to FIG. 8, in some embodiments, the semiconductor device structure 80 includes a stack structure of a gate layer 810, a gate dielectric layer 820, and a semiconductor layer 830 sequentially stacked from the bottom to the top. In some embodiments, the structure 80 includes a source terminal 860A and a drain terminal 860B located over the semiconductor layer 830 of the stack structure with complex regions 835 located there-between. In some embodiments, the source terminal 860A and the drain terminal 860B are separate from each other by an interlayer dielectric (ILD) layer 850. In some embodiments, the source terminal 860A and the drain terminal 860B are physically separate from the underlying semiconductor layer 830 by the complex regions 835 located there-between. In some embodiments, the complex regions 835 are located only directly under the source and drain terminals 860A, 860B and between the semiconductor layer 830 and the source and drain terminals 860A, 860B. In some embodiments, the ILD layer 850 located between the source and drain terminals 860A, 860B is in direct contact with the semiconductor layer 830. In FIG. 8, the source terminal 860A includes a barrier layer 862A and the drain terminal 860B also includes a barrier layer 862B.

In the exemplary embodiments, the formation of the complex region(s) located between the channel layer (e.g. semiconductor layer) and the source and drain terminals leads to reduced contact resistance between the channel layer and the source and drain terminals. Hence, the performance of the semiconductor device is boosted.

FIG. 10 to FIG. 16 are schematic cross-sectional views of various stages in a manufacturing method of a semiconductor device in accordance with some embodiments of the disclosure.

Figure 10:
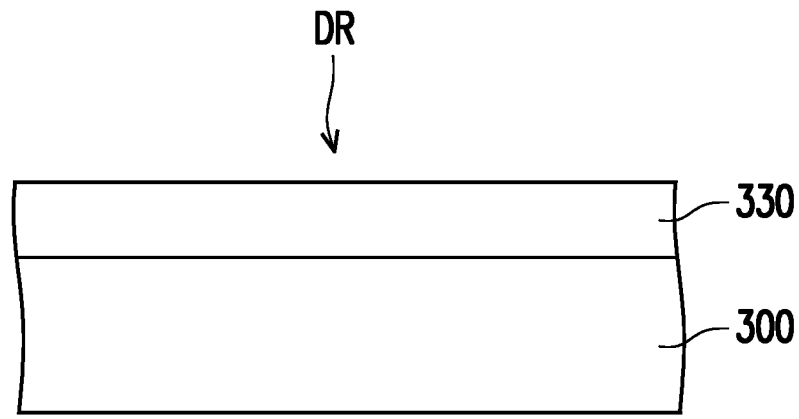
FIG. 10 to FIG. 16 are schematic cross-sectional views of various stages in a manufacturing method of a semiconductor device in accordance with some embodiments of the disclosure.

Referring to FIG. 10, in some embodiments, a substrate 300 is provided. In FIGS. 10-16, only a portion of the device region DR of the substrate 300 is shown for illustration purposes. In some embodiments, the substrate 300 is similar to the substrate 100, 900 in the previous embodiments, and the substrate 300 may include one or more active component such as transistors, diodes, optoelectronic devices and/or one or more passive components such as capacitors, inductors and resistors. In some embodiments, as shown in FIG. 10, a semiconductor material layer 330 is formed over the substrate 300. In one embodiment, the semiconductor material layer 330 is formed with a thickness ranging from about 1 nm to about 50 nm. In some embodiments, the material of the semiconductor material layer 330 includes indium gallium zinc oxide (IGZO), or a similar conducting oxide semiconductor material such as indium tin oxide (ITO), indium tungsten oxide (IWO), indium zinc oxide (IZO) or zinc tin oxide (ZTO). In some embodiments, the formation of the semiconductor material layer 330 and the blocking material layer 340 includes one or more deposition processes selected from CVD, ALD, and PVD. In one embodiment, the semiconductor material layer 330 is made of IGZO formed by PVD.

Figure 11:
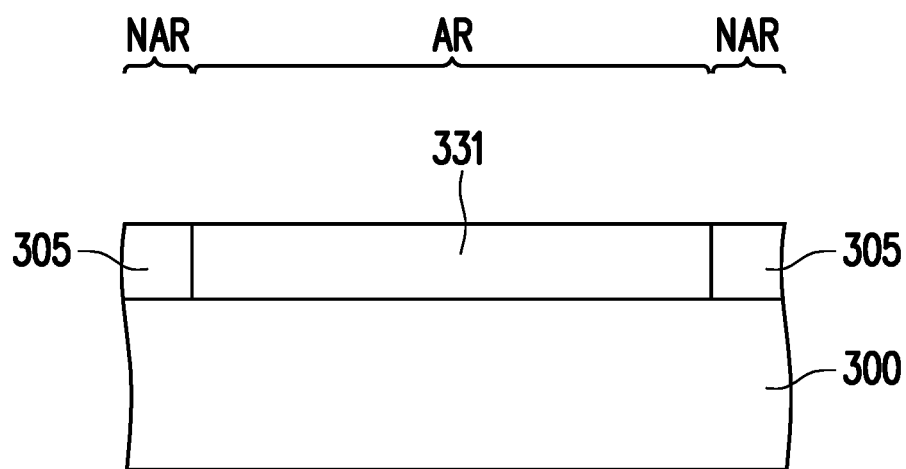

Referring to FIG. 10 and FIG. 11, in some embodiments, the semiconductor material layer 330 is patterned into a semiconductor layer 331 on the substrate 300 and an active region AR is defined through the patterning process. Later, isolation structures 305 are formed in a non-active region NAR surrounding the active region AR for isolation. As shown in FIG. 11, in some embodiments, more than one isolation structures 305 are formed on the substrate 300. In certain embodiments, the isolation structures 305 are trench isolation structures, and the insulator material of the isolation structures 305 includes silicon oxide, silicon nitride, silicon oxynitride, a spin-on dielectric material, or a low-k dielectric material.

Figure 12:
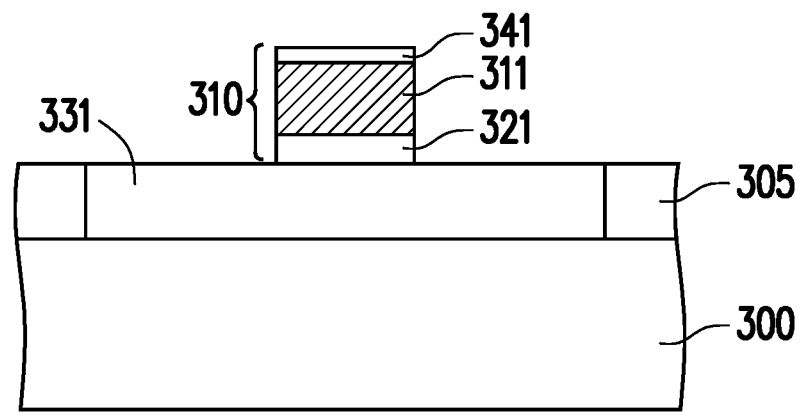

Referring to FIG. 12, a gate dielectric layer 321, a gate layer 311 and a blocking layer 341 are formed and stacked in sequence on the semiconductor layer 331. In some embodiments, a gate dielectric material layer (not shown), a gate material layer (not shown) and blocking material layer (not shown) are sequentially formed over the semiconductor layer 331 and the isolation structures 305, and then are patterned into the stack of the gate dielectric layer 321, the gate layer 311 and the blocking layer 341 through photolithographic and etching processes. As shown in FIG. 12, in exemplary embodiments, the stack structure 310 of the gate dielectric layer 321, the gate layer 311 and the blocking layer 341 is disposed on the semiconductor layer 331. In some embodiments, the stack structure 310 partially covers the underlying semiconductor layer 331, exposing portions of the semiconductor layer 331.

In some embodiments, as seen in FIG. 12, the stack structure 310 of the gate dielectric layer 321, the gate layer 311 and the blocking layer 341 is located within the active region AR. For example, the stack structure 310 may be considered as a gate structure with the blocking layer thereon. The sidewalls of the stack structure 310 of the gate dielectric layer 321, the gate layer 311 and the blocking layer 341 in FIG. 12 may be shown to be vertically aligned or coplanar, and the semiconductor layer 331 may have a different pattern from the pattern of the stack structure 310 of the gate dielectric layer 321, the gate layer 311 and the blocking layer 341. However, it is understood that the various layers of the stack structure may have different patterns or configurations depending on product designs.

Figure 13:
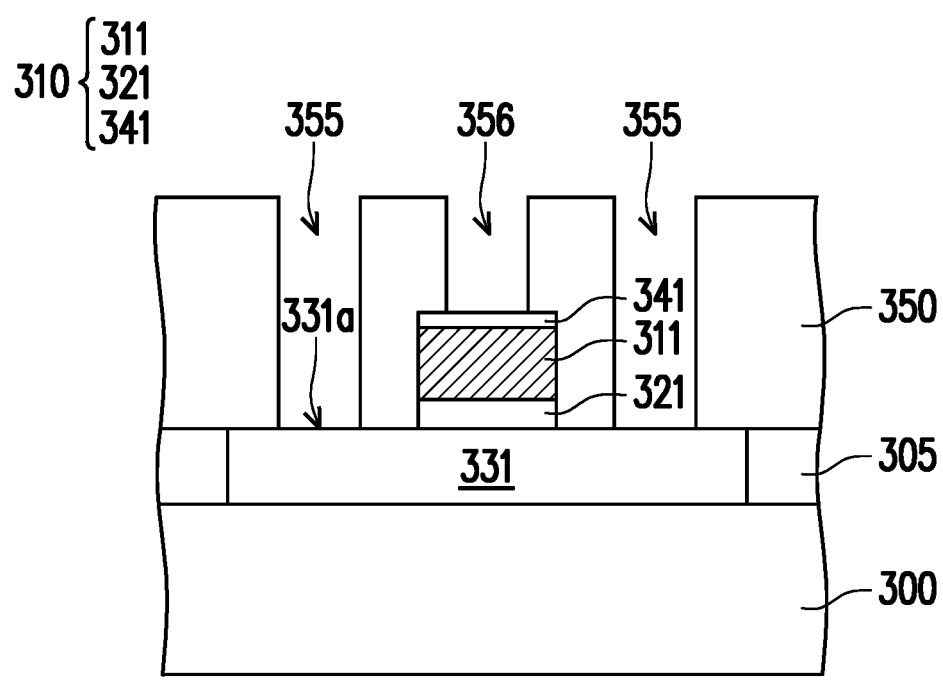

In FIG. 13, an ILD layer 350 is formed with contact openings 355, 356 over the substrate 300 covering the stack structure 310 of the gate dielectric layer 321, the gate layer 311 and the blocking layer 341, the exposed semiconductor layer 331 and the isolation structures 305. The materials and the formation methods of the ILD layer 350 are similar to those of the ILD layer(s) as described in the above paragraphs, and details will be omitted herein for simplicity.

Referring to FIG. 13, the contact openings 355 and 356 are formed in the ILD layer 350 to respectively expose portions of the semiconductor layer 331 and the blocking layer 341. In some embodiments, the contact openings 355 expose portions of the top surface 331a of the semiconductor layer 331. In some embodiments, the contact opening(s) 356 exposes the blocking layer 341. As seen in FIG. 13, the contact openings 355 and 356 are shown with substantially vertical sidewalls. It is understood that the contact openings may be formed with slant sidewalls if feasible. The number or size of the contact opening(s) is not limited to the number or size as depicted in the drawings.

In some embodiments, when the optional blocking layer is omitted, the contact opening(s) exposing the gate structure (such as contact opening 356) may be formed later in the ILD layer after the processing treatment is performed.

Figure 14:
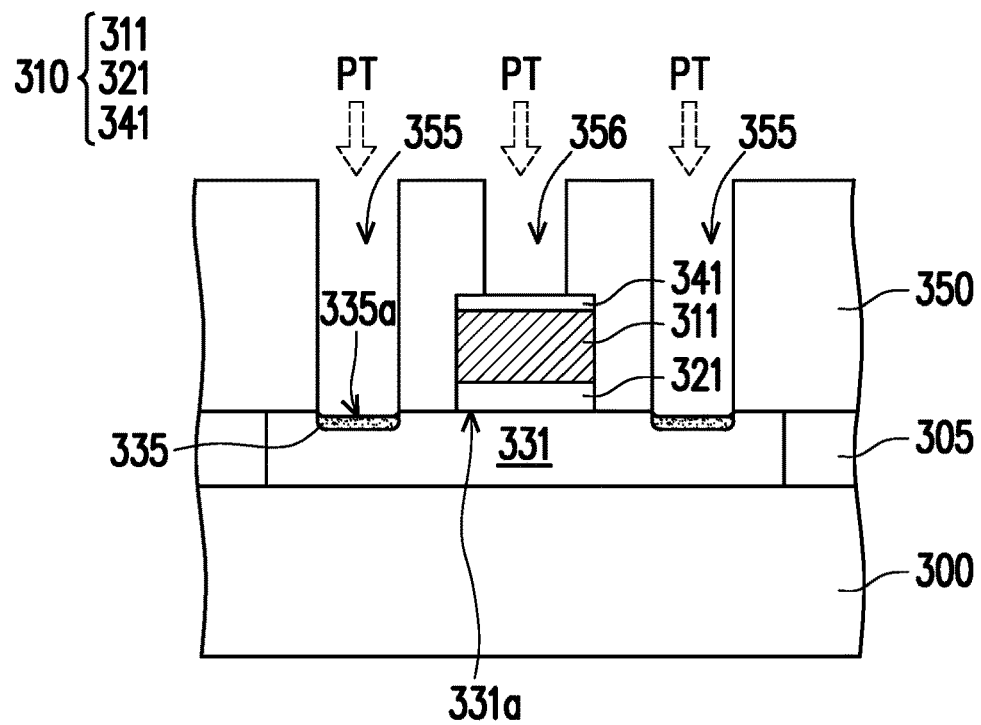

Thereafter, in FIG. 14, a processing treatment PT is performed to the semiconductor layer 331 that is exposed by the contact openings 355 and complex regions 335 are formed in the semiconductor layer 331. During the processing treatment PT, at the location exposed by the opening 356, the blocking layer 341 protects the underlying gate structure of the gate dielectric layer 321, the gate layer 311 from being damaged. In some embodiments, the processing treatment PT includes performing an argon plasma treatment and then a hydrogen annealing process. Optionally, in some embodiments, the processing treatment PT further includes performing an oxygen annealing process. Suitable reactants and conditions are utilized and similar to the details provided in the above embodiments. During the argon plasma treatment, through the bombardment of plasma or charges to the exposed surface 331a of the semiconductor layer 331, more oxygen vacancies are generated in the semiconductor layer 331. In the later performed hydrogen annealing process, hydrogen is trapped in the oxygen vacancy sites, and a stable hydrogen-containing complex is formed at the sites to form the complex regions 335. In some embodiments, the complex region 135 includes n-type complexes. In one embodiment, the complex region(s) 335 has higher doping levels and increased conductivity. In one embodiment, the complex region(s) 335 has a higher electron doping level (e.g., having a doping level value ranging from 1E18 cm$^{-3}$ to 1E21 cm$^{-3}$). The formed stable complex in the complex region(s) 135 may serve as a shallow level donor. In FIG. 14, although exposed by the contact opening 356, the blocking layer 341 may function as the blocking layer to hinder H entering into the underlying layer(s) of the gate structure or to prevent the underlying layer(s) being damaged during the processing treatment PT.

In some embodiments, in FIG. 14, during the processing treatment PT, the exposed portions of the top surface 331a of the semiconductor layer 331 are bombarded and damaged during the plasma treatment, and the later formed complex regions 335 extend from the damaged surface 335a further into the semiconductor layer 331. In some embodiments, the treated surface 335a has a surface roughness higher than that of the untreated top surface 331a of the semiconductor layer 331. In certain embodiments, dishing may occur in the exposed portions of the top surface 331a of the semiconductor layer 331, and the complex region(s) 335 may have a dished or bowl-shape surface. The complex region(s) 335 formed in the semiconductor layer 331 that are exposed by the contact openings 355 may have a dished or bowl-shape surface 335a, and the complex regions 335 may have a thickness (i.e. a depth extend vertically along the thickness direction from the top surface 335a into the semiconductor layer 331) varying at different locations.

Figure 15:
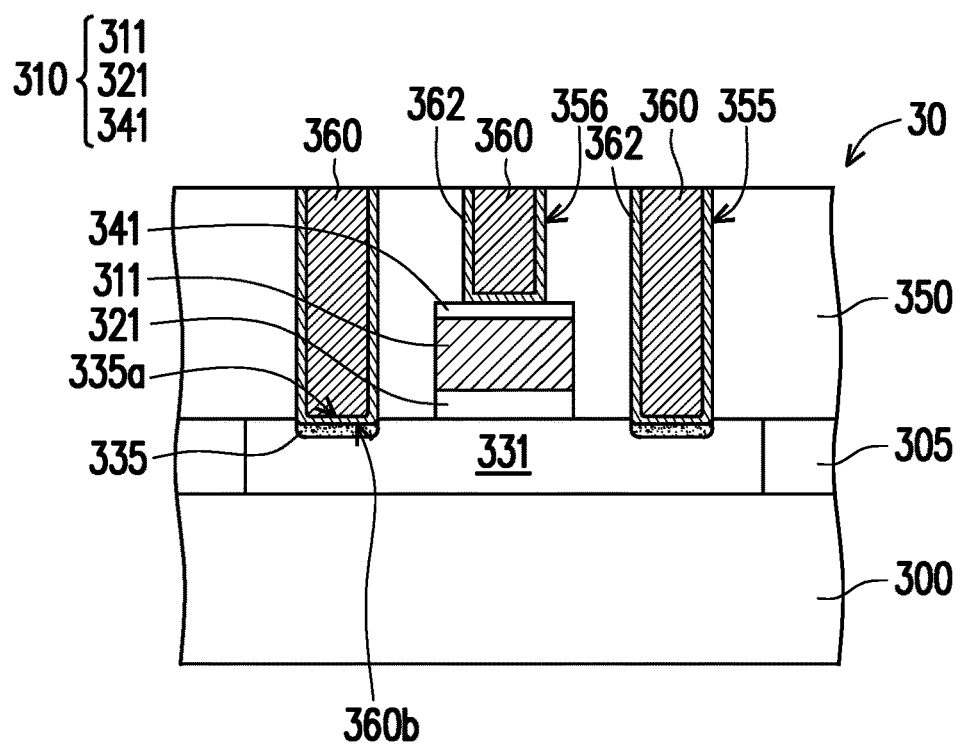

Referring to FIG. 15, contact terminals 360 are formed in the contact openings 355 and in the contact opening 356. In some embodiments, the contact terminals 360 formed in the contact openings 355 are respectively connected to the complex regions 335. In certain embodiments, the contact terminals 360 are formed directly on the damaged (or even concave) surface 335a of the complex regions 335, and the bottom surfaces 360b of the contact terminals 360 are in direct contact with the complex regions 335 formed in the contact openings 355. In some embodiments, when the blocking layer 341 is made of a conductive material, the contact terminal(s) 360 formed in the contact opening(s) 356 is connected to the blocking layer 341. In certain embodiments, a barrier layer 362 is deposited over the contact openings 355, 356 and conformally covers the sidewalls and bottoms of the contact openings 355, 356. Similar materials and formation methods for forming the contact terminals 160 may be used for forming the contact terminals 360, and the contact terminals 360 may be formed with seed layer and/or adhesion layer, but the details shall be skipped herein for simplicity. In alternative embodiments, when the blocking layer 341 is not made of an electrically conductive material, the blocking layer 341 exposed by the contact opening 356 may be further etched to expose the gate layer 311, and the contact terminal 360 formed in the contact opening 356 is directly connected to the gate layer 311.

Referring to FIG. 15, in some embodiments, a transistor structure 30 is obtained and the contact terminals 360 function as the source and drain terminals of the transistor. In FIG. 15, the transistor structure 30 includes the semiconductor layer 331, the stack structure 310 having the gate layer 311 stacked on the gate dielectric layer 321 and the blocking layer 341 located on the gate layer 311, and the contact terminals 360 located on the semiconductor layer 331 and connected with the complex regions 335. The semiconductor layer 331 functions as a channel layer, and the complex regions 335 located between the contact terminals 360 and the semiconductor layer 331 helps lowering the contact resistance of the source and drain terminals. In some embodiments, the transistor structure 30 is a top-gated transistor structure or a front gate transistor structure.

Figure 16:
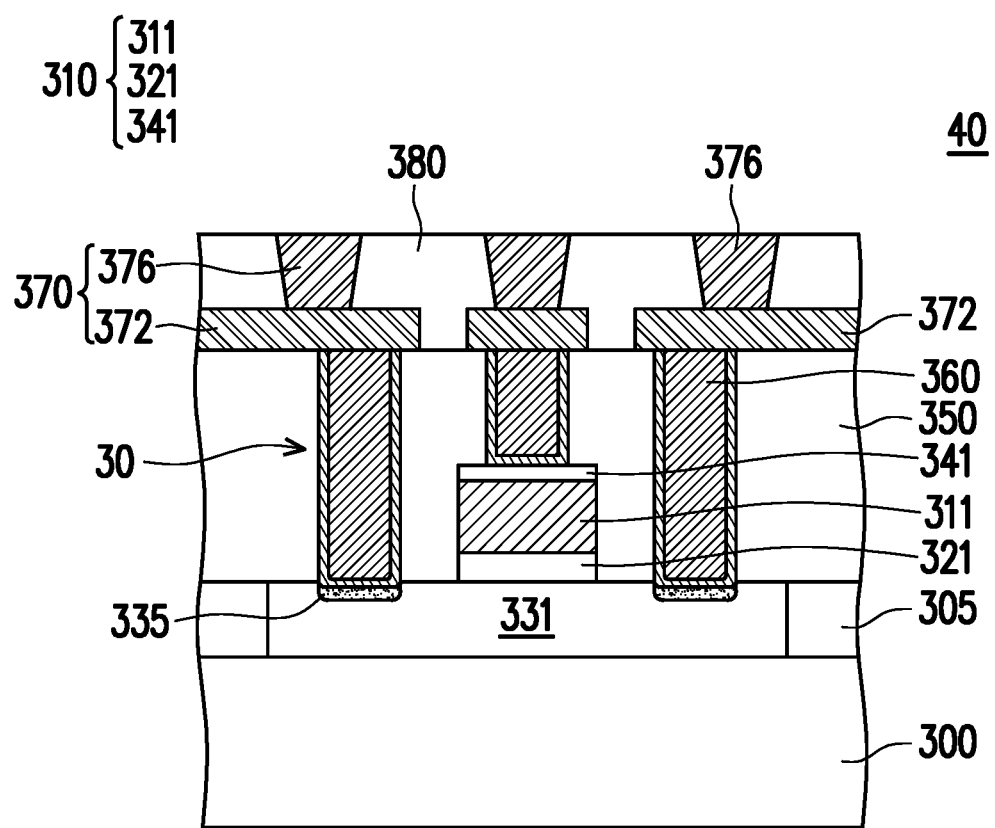

Referring to FIG. 16, in certain embodiments, an interconnecting structure 370 and another ILD layer 380 are formed on the ILD layer 350, and the semiconductor device structure 40 is formed. In some embodiments, the interconnecting structure 370 is formed on and in direct contact with the contact terminals 360, and is electrically connected with the contact terminals 360 of the transistor structure 30, so that the transistor structure 30 is further electrical connected to other components or devices. In some embodiments, the interconnecting structure 370 includes metal lines 372 and metal vias 376 connected to the metal lines 372. Similar materials and formation methods for forming the interconnecting structure 170 may be used for forming the interconnecting structure 370, and the interconnecting structure 370 may be formed with the liner layer(s), seed layer and/or barrier/adhesion layer, and multiple levels of interconnecting structures may be formed for electrical connection and interconnection.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 17:
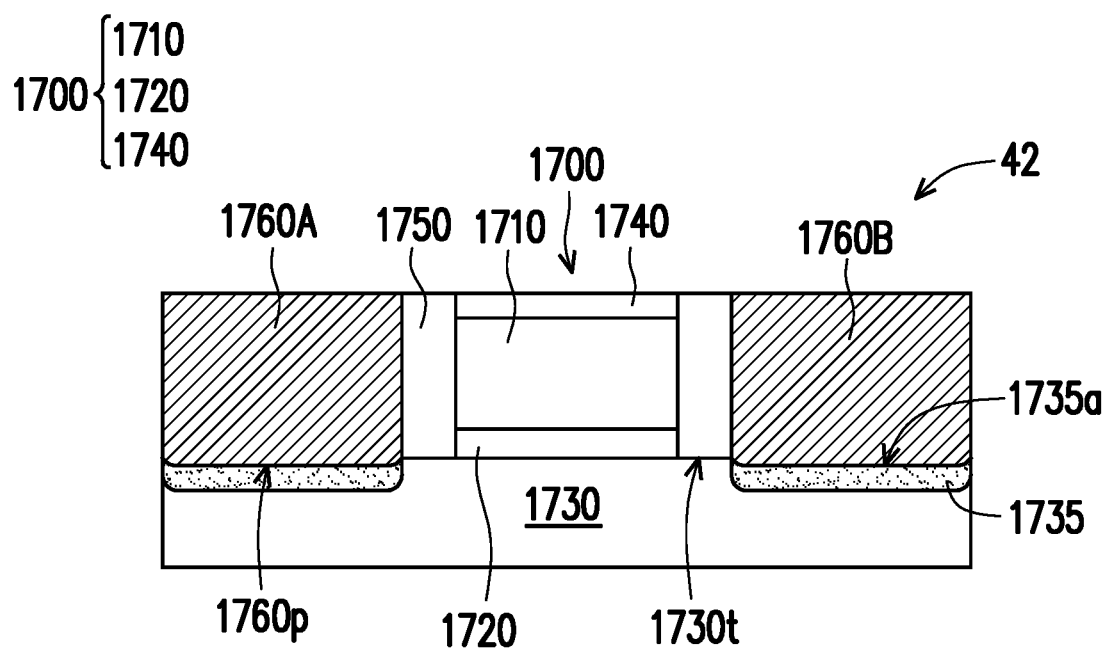
FIG. 17 and FIG. 18 are schematic cross-sectional views showing a semiconductor device in accordance with some embodiments of the disclosure.

FIG. 17 is a schematic cross-sectional view showing a semiconductor device in accordance with some embodiments of the disclosure. Referring to FIG. 17, in some embodiments, the semiconductor device structure 42 includes a gate structure 1700 of a blocking layer 1740, a gate layer 1710 and a gate dielectric layer 1720 sequentially stacked on a semiconductor layer 1730 (from the top to the bottom). In some embodiments, the semiconductor device structure 42 includes a source terminal 1760A and a drain terminal 1760B located directly on the complex regions 1735. In some embodiments, the source terminal 1760A and the drain terminal 1760B are located at two opposite sides of the gate structure 1700 and are separate from the gate structure 1700 by an interlayer dielectric (ILD) layer 1750 located there-between. In some embodiments, the source terminal 1760A and the drain terminal 1760B may further include seed layer(s) and/or adhesion/barrier layer(s). In some embodiments, the complex regions 1735 may have a concave surface 1735a concave to the top surface 1730t of the semiconductor layer 1730, and the complex regions 1735 are in direct contact with the source terminal 1760A and the drain terminal 1760B respectively. In some embodiments, the ILD layer 1750 sandwiched between the source terminal 1760A and the drain terminal 1760B is located directly on the semiconductor layer 1730. In FIG. 17, the complex region 1735 is formed between the semiconductor layer 1730 and the bottom surfaces 1760p of the source and drain terminals 1760A, 1760B.

Figure 18:
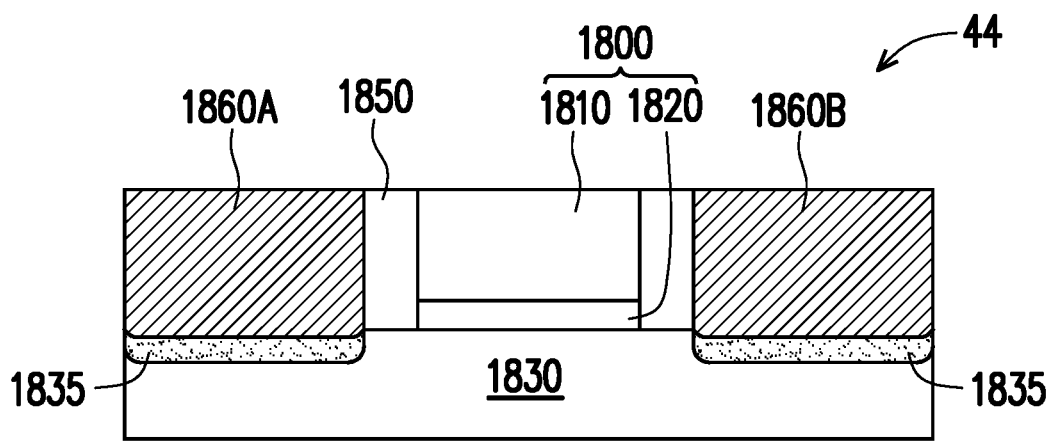

FIG. 18 is a schematic cross-sectional view showing a semiconductor device in accordance with some embodiments of the disclosure. The structure shown in FIG. 18 is similar to but different from the structure shown in FIG. 17, and the main structural difference lies in that the blocking layer is absent in the semiconductor device structure 44 as shown in FIG. 18. Referring to FIG. 18, in some embodiments, the semiconductor device structure 44 includes a gate structure 1800 of a gate layer 1810 and a gate dielectric layer 1820 stacked on a semiconductor layer 1830. In some embodiments, the structure 44 includes a source terminal 1860A and a drain terminal 1860B located on the semiconductor layer 1830 with complex regions 1835 located there-between. In some embodiments, the source terminal 1860A and the drain terminal 1860B are physically separate from (but electrically connected with) the underlying semiconductor layer 1830 by the complex regions 1835. In some embodiments, the gate structure 1800 is covered by an ILD layer 1850 and the gate dielectric layer 1820 are in direct contact with the semiconductor layer 1830.

Figure 19:
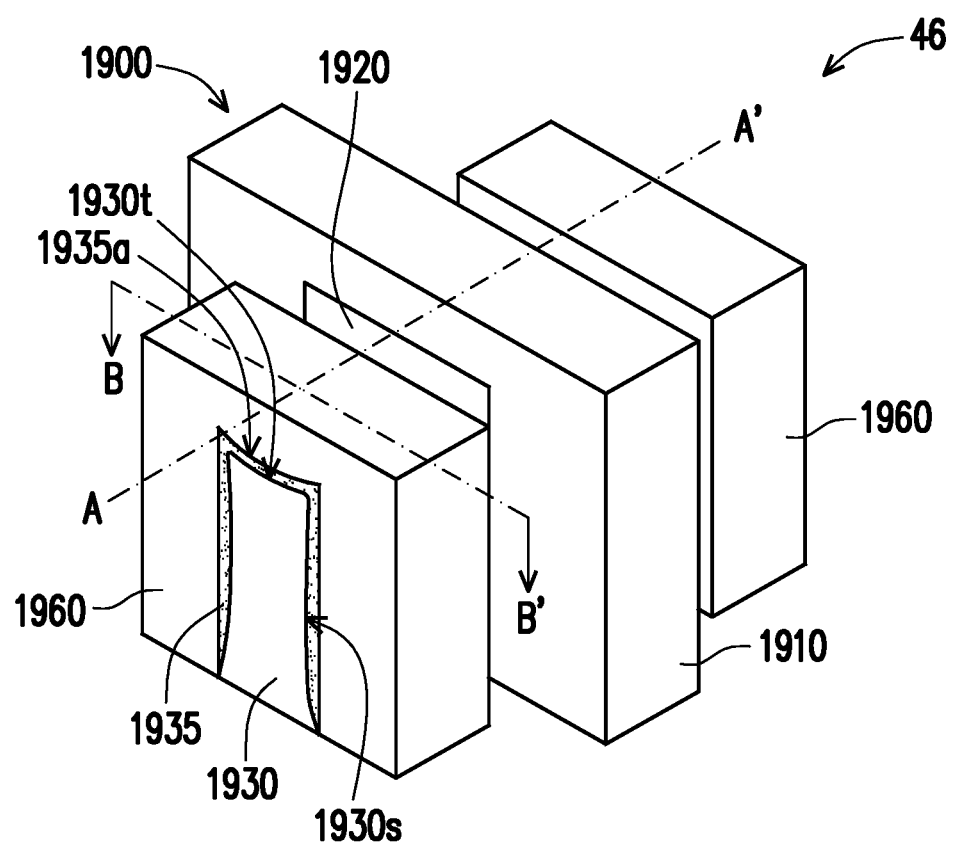
FIG. 19 is a schematic three-dimensional view showing a semiconductor device in accordance with some embodiments of the disclosure.
Figure 20:
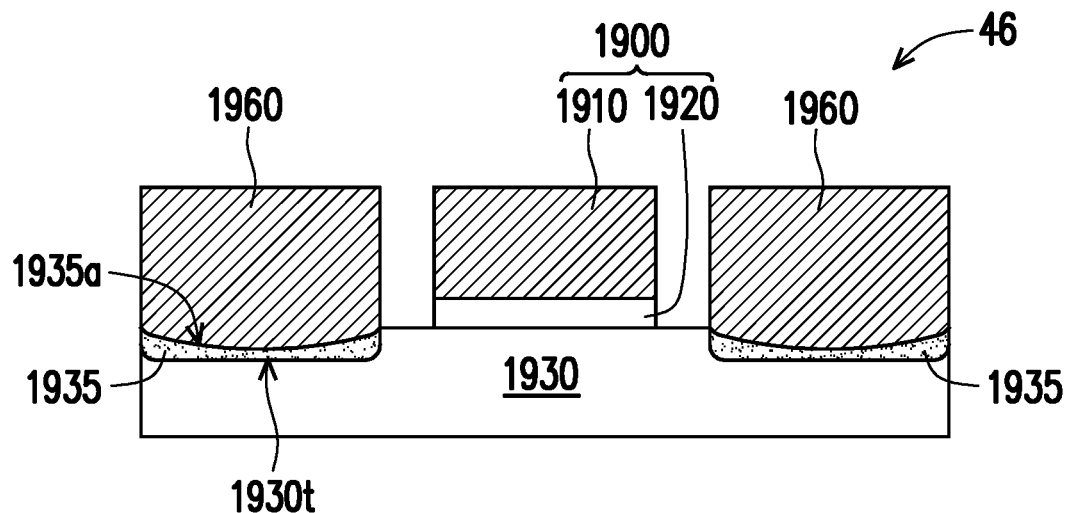
FIG. 20 and FIG. 21 are schematic cross-sectional views showing the semiconductor device in accordance with some embodiments of the disclosure.
Figure 21:
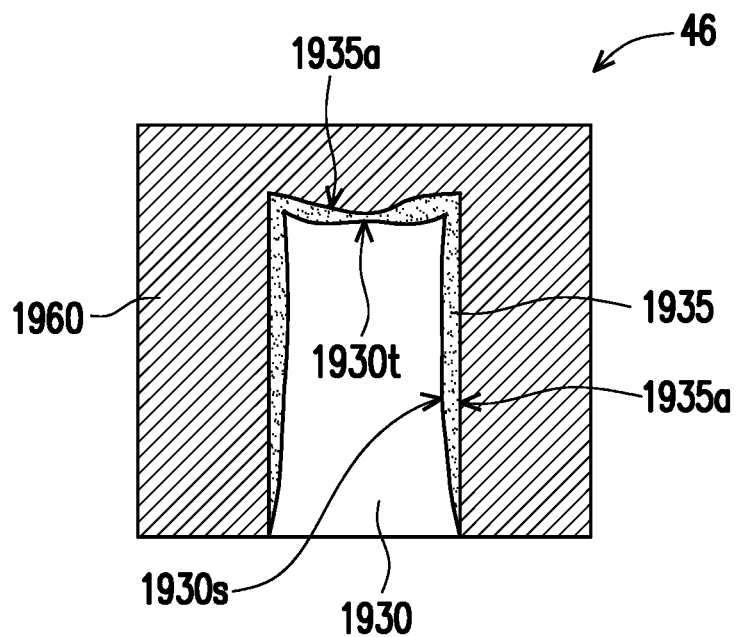

FIG. 19 is a schematic three-dimensional view showing a semiconductor device in accordance with some embodiments of the disclosure. FIG. 20 and FIG. 21 are schematic cross-sectional views respectively along the lines A-A' and B-B' showing the semiconductor device of FIG. 19 in accordance with some embodiments of the disclosure.

Referring to FIG. 19, in some embodiments, the semiconductor device structure 46 includes a semiconductor layer 1930 and complex regions 1935 located between source and drain terminals 1960 and the semiconductor layer 1930. From FIG. 19, FIG. 20 and FIG. 21, it is seen that the complex regions 1935 occupy the interfaces between the source and drain terminals 1960 and the semiconductor layer 1930 and extend over not just the top surface 1930t but also two opposite side surfaces 1930s of the semiconductor layer 1930. In some embodiments, the reverse U-shaped complex region 1935 has damaged surfaces 1935a opposing to the top surface 1930t and the two opposite side surfaces 1930s of the semiconductor layer 1930. That is, the complex region 1935 covers at least three sides of the semiconductor layer 1930 and is surrounded by the source/drain terminal 1960. In one embodiment, the surface 1935a at top side of the reverse U-shaped complex region 1935 is more damaged or dented than other surfaces 1935a at outer sidewalls of the reverse U-shaped complex region 1935. Referring to FIG. 19 and FIG. 20, a gate structure 1900 of a gate layer 1910 and a gate dielectric layer 1920 is disposed on and surrounds the top side and the two opposite sides of the semiconductor layer 1930. Referring to FIG. 19, in some embodiments, the gate structure 1900 may shape like a reverse U shape wrapping around the semiconductor layer 1930. In some embodiments, the semiconductor device structure 46 includes source and drain terminals 1960 located directly on the complex regions 1935, and the source and drain terminals 1960 each may shape like a reverse U shape wrapping around the complex region 1935 and the semiconductor layer 1930. In some embodiments, the source and drain terminals 1960 are located at two opposite sides of the gate structure 1900 and are separate from the gate structure 1900 by an interlayer dielectric (ILD) layer (not shown) located there-between. In FIG. 19, FIG. 20 and FIG. 21, the ILD layer is not shown for simplicity. In some embodiments, the source and drain terminals 1960 may further include seed layer(s) and/or adhesion/barrier layer(s). In some embodiments, the complex region 1935 is in direct contact with the source and drain terminals 1960 and in direct contact with the semiconductor layer 1930 but there is no complex region formed between the gate dielectric layer 1920 and the semiconductor layer 1930. In some embodiments, the semiconductor device structure 46 includes a double-gated transistor structure.

In the exemplary embodiments, the formation of the complex regions between the channel layer (e.g. semiconductor layer) and the source and drain terminals leads to lower contact resistance between the channel layer and the source and drain terminals. Overall, the performance of the semiconductor device is enhanced. In some embodiments, the complex region formed in the semiconductor layer modulates the surface characteristics of the semiconductor layer and lowers the contact resistance between the semiconductor layer and the source and drain terminals.

In some embodiments of the present disclosure, a semiconductor device is described. The semiconductor device includes a semiconductor channel layer, a gate structure, complex regions, a source terminal and a drain terminal. The gate structure is disposed on the semiconductor channel layer. The source terminal and the drain terminal are disposed on the semiconductor channel layer. The complex regions ae respectively disposed between the source terminal and the semiconductor channel layer and between the drain terminal and the semiconductor channel layer In some embodiments of the present disclosure, a semiconductor device is described. The semiconductor device includes a semiconductor material layer, a gate layer, a gate dielectric layer, a source and a drain. The gate layer is disposed over the semiconductor material layer, and the gate dielectric layer is disposed between the gate layer and the semiconductor material layer. The source and the drain are disposed on the semiconductor material layer. The semiconductor material layer includes complex regions, and the complex regions are in direct contact with the source and the drain.

In some embodiments of the present disclosure, a method for forming a semiconductor device is described. A gate structure and a semiconductor layer are formed. An insulating layer is formed over the gate structure and the semiconductor layer. Contact openings are formed in the insulating layer exposing portions of the semiconductor layer. A processing treatment is performed to the exposed portions of the semiconductor layer to form complex regions. Source and drain terminals are formed on the complex regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor oxide channel layer including indium gallium zinc oxide (IGZO), indium tin oxide (ITO), indium tungsten oxide (IWO), indium zinc oxide (IZO), zinc tin oxide (ZTO) or combinations thereof;
a gate structure disposed over the semiconductor oxide channel layer;
a metal feature disposed over the semiconductor oxide channel layer; and
a complex region establishing an interface between the metal feature and a region of the semiconductor oxide channel layer, wherein a material of the complex region includes a hydrogen-doped complex of the material of the semiconductor oxide channel layer.

2. The semiconductor device of claim 1, wherein the complex region directly contacts the metal feature and directly contacts the region of the semiconductor oxide channel layer.

3. The semiconductor device of claim 2, further comprising a blocking layer region extending on a top surface of the semiconductor oxide channel layer and laterally spaced apart from the complex region.

4. The semiconductor device of claim 3, wherein a material of the blocking layer region includes polysilicon, ITO or IGZO doped with silicon, or combinations thereof.

5. The semiconductor device of claim 1, wherein the gate structure is located at a first side of the semiconductor oxide channel layer, and the metal feature is located at a second side of the semiconductor oxide channel layer that is opposite to the first side.

6. The semiconductor device of claim 1, wherein the gate structure and the metal feature are located on a same side of the semiconductor oxide channel layer.

7. The semiconductor device of claim 6, further comprising a blocking layer located on a surface of the gate structure.

8. The semiconductor device of claim 7, wherein a material of the blocking layer includes polysilicon, ITO or IGZO doped with silicon, or combinations thereof.

9. The semiconductor device of claim 8, wherein the complex region extends over three sides of the semiconductor oxide channel layer.

10. A semiconductor device, comprising:
a semiconductor oxide channel layer extending from a first outer channel sidewall to a second outer channel sidewall, the semiconductor oxide channel layer having a continuous planar upper surface that extends entirely from the first outer channel sidewall to the second outer channel sidewall;
a gate structure disposed over planar upper surface of the semiconductor oxide channel layer, the gate structure having a first gate edge proximate to the first outer channel sidewall and a second gate edge opposite the first gate edge and proximate to the second outer channel sidewall;
a source terminal disposed on the semiconductor oxide channel layer and arranged between the first gate edge of the gate structure and the first outer channel sidewall;
a drain terminal disposed on the semiconductor oxide channel layer and arranged between the second gate edge of the gate structure and the second outer channel sidewall; and
a complex region disposed in the semiconductor oxide channel layer beneath the continuous planar upper surface and arranged between the first gate edge of the gate structure and the first outer channel sidewall or between the second gate edge of the gate structure and the second outer channel sidewall; and
wherein a material of the semiconductor oxide channel layer includes indium gallium zinc oxide (IGZO), indium tin oxide (ITO), indium tungsten oxide (IWO), indium zinc oxide (IZO), zinc tin oxide (ZTO) or combinations thereof, and the complex region includes a hydrogen-doped complex of the material of the semiconductor oxide channel layer.

11. The semiconductor device of claim 10:
wherein the drain terminal comprises metal, and
wherein the complex region directly contacts the metal of the drain terminal and directly contacts the semiconductor oxide channel layer.

12. The semiconductor device of claim 10:
wherein the source terminal comprises metal, and
wherein the complex region directly contacts the metal of the source terminal and directly contacts the semiconductor oxide channel layer.

13. The semiconductor device of claim 10, the source terminal and the drain terminal are connected with the semiconductor oxide channel layer through the complex region extending over three sides of the semiconductor oxide channel layer.

14. The semiconductor device of claim 10, wherein the complex region has a curved surface.

15. The semiconductor device of claim 10, further comprising a metallic contact connected to the gate structure.

16. A semiconductor device, comprising:
a semiconductor oxide channel layer;
a gate structure disposed on the semiconductor oxide channel layer;
an insulating layer over the gate structure and the semiconductor oxide channel layer;
a source terminal and a drain terminal disposed over the semiconductor oxide channel layer and extending vertically through the insulating layer, wherein the source terminal and drain terminal have upper surfaces that are level with a planar upper surface of the insulating layer, and the planar upper surface of the insulating layer extends continuously from the source terminal to the drain terminal; and
a first complex region disposed between the source terminal and the semiconductor oxide channel layer and a second complex region disposed directly beneath the drain terminal between the drain terminal and the semiconductor oxide channel layer;
wherein a material of the semiconductor oxide channel layer includes indium gallium zinc oxide (IGZO), indium tin oxide (ITO), indium tungsten oxide (IWO), indium zinc oxide (IZO), zinc tin oxide (ZTO) or combinations thereof, and the first and second complex regions include a hydrogen-doped complex of the material of the semiconductor oxide channel layer.

17. The semiconductor device of claim 16, wherein the gate structure is located at a first side of the semiconductor oxide channel layer, while the source terminal and the drain terminal are located at a second side of the semiconductor oxide channel layer that is opposite to the first side.

18. The semiconductor device of claim 16, further comprising a blocking layer extending on a top surface of the semiconductor oxide channel layer and extending laterally between the source terminal and the drain terminal.

19. The semiconductor device of claim 18, wherein a material of the blocking layer includes polysilicon, ITO or IGZO doped with silicon, or combinations thereof.

20. The semiconductor device of claim 16, wherein the gate structure, the source terminal, and the drain terminal are located at a same side of the semiconductor oxide channel layer, and the source terminal and the drain terminal are located at two opposite sides of the gate structure.

* * * * *